United States Patent
Pisigan et al.

(10) Patent No.: US 8,637,394 B2
(45) Date of Patent: Jan. 28, 2014

(54) INTEGRATED CIRCUIT PACKAGE SYSTEM WITH FLEX BUMP

(75) Inventors: Jairus Legaspi Pisigan, Singapore (SG); Henry Descalzo Bathan, Singapore (SG); Arnel Trasporto, Singapore (SG); Jeffrey D. Punzalan, Singapore (SG)

(73) Assignee: STATS ChipPAC Ltd., Singapore (SG)

( * ) Notice: Subject to any disclaimer, the term of this patent is extended or adjusted under 35 U.S.C. 154(b) by 1041 days.

(21) Appl. No.: 11/773,886

(22) Filed: Jul. 5, 2007

(65) Prior Publication Data
US 2009/0008761 A1 Jan. 8, 2009

(51) Int. Cl.
*H01L 21/44* (2006.01)
*H01L 23/48* (2006.01)

(52) U.S. Cl.
USPC ........... 438/617; 438/613; 257/737; 257/784; 257/E23.024; 257/E21.509

(58) Field of Classification Search
USPC .................. 257/686, 692, 784, 737, E23.024, 257/E21.509; 438/613, 617
See application file for complete search history.

(56) References Cited

U.S. PATENT DOCUMENTS

| | | | |
|---|---|---|---|
| 6,017,812 A | 1/2000 | Yonezawa et al. | |
| 6,165,887 A * | 12/2000 | Ball | 438/613 |
| 6,232,211 B1 * | 5/2001 | Tsukahara | 438/612 |
| 6,715,666 B2 * | 4/2004 | Imai et al. | 228/180.5 |
| 6,815,836 B2 | 11/2004 | Ano | |
| 6,863,208 B2 * | 3/2005 | Lee | 228/180.5 |
| 7,044,357 B2 | 5/2006 | Mii | |
| 7,188,759 B2 | 3/2007 | Calpito et al. | |
| 7,229,906 B2 | 6/2007 | Babinetz et al. | |
| 7,271,497 B2 * | 9/2007 | Joshi et al. | 257/780 |
| 2002/0047213 A1 * | 4/2002 | Komiyama et al. | 257/777 |
| 2004/0152292 A1 * | 8/2004 | Babinetz et al. | 438/617 |
| 2005/0109819 A1 * | 5/2005 | Qin et al. | 228/180.5 |
| 2005/0191839 A1 * | 9/2005 | Wong et al. | 438/617 |

* cited by examiner

Primary Examiner — Nitin Parekh
(74) Attorney, Agent, or Firm — Ishimaru & Associates LLP (57) ABSTRACT

An integrated circuit package system includes: forming a flex bump over an integrated circuit device structure, the flex bump having both a base portion and an offset portion over the base portion; forming a first ball bond of a first internal interconnect over the offset portion; and encapsulating the integrated circuit device structure, the flex bump, and the first internal interconnect.

18 Claims, 7 Drawing Sheets

INTEGRATED CIRCUIT PACKAGE SYSTEM WITH FLEX BUMP

TECHNICAL FIELD

The present invention relates generally to an integrated circuit package system, and more particularly to an integrated circuit package system with electrical interconnects.

BACKGROUND ART

Across all sectors, industries, and geographies, demands continue for the electronic industry to provide products that are lighter, faster, smaller, multi-functional, more reliable, and more cost-effective. In order to meet these requirements of so many and varied consumers, more electrical circuits need to be more highly integrated to provide the functions demanded. Across virtually all applications, there continues to be growing demand for reducing size, increasing performance, and improving features of integrated circuits.

These seemingly endless requirements are no more visible than with products in our daily lives. Smaller and denser integrated circuits are required in many portable electronic products, such as cellular phones, portable computers, voice recorders, etc. as well as in many larger electronic systems, such as cars, planes, industrial control systems, etc.

As the demand grows for smaller electronic products with more features, manufacturers are seeking ways to include more features as well as reduce the size of the integrated circuits. Increased miniaturization of electronic products typically involves miniaturization of components, greater packaging density of integrated circuits ("ICs"), higher performance, and lower cost. As new generations of electronic products are released, the number of integrated circuits used to fabricate them tends to decrease due to advances in technology. Simultaneously, the functionality of these products increases.

Semiconductor package structures continue to advance toward miniaturization to increase the density of the components that are packaged therein while decreasing the sizes of the end products having the IC products. This is in response to continually increasing demands on information and communication apparatus for ever-reduced sizes, thicknesses, and costs, along with ever-increasing performance.

Different challenges arise from increased functionality integration and miniaturization. For example, a semiconductor product having increased functionality may be made smaller but may still be required to provide a large number of inputs/outputs (I/O). The size reduction increases the I/O density or decreases the I/O pitch for the integrated circuit package and its respective integrated circuit carriers.

The ever-increasing I/O density trend presents a myriad of manufacturing problems. Some of these problems reside integrated circuit manufacturing realm, such as fine pitch connections and reliability of these connections. Others problems involve mounting these increase I/O density integrated circuits on carriers for packaging. Yet other problems reside in the realm of the printed circuit board or the system board that receives the integrated circuit package having the fine pitch I/O or a large number of I/Os in an ever-shrinking space.

As an example of the problems of miniaturization with a large number I/O, the contact on a substrate for connection to an integrated circuit die is place so close to the die such that capillary used for wire bonding hits on top die edge during wire bonding. This problem also exists in bonding a top die to a bottom die due to tight pad-to-die edge clearance.

Thus, a need still remains for an integrated circuit package system providing low cost manufacturing, improved yield, and improved reliability. In view of the ever-increasing need to save costs and improve efficiencies, it is more and more critical that answers be found to these problems.

Solutions to these problems have been long sought but prior developments have not taught or suggested any solutions and, thus, solutions to these problems have long eluded those skilled in the art.

DISCLOSURE OF THE INVENTION

The present invention provides an integrated circuit package system including: forming a flex bump over an integrated circuit device structure, the flex bump having both a base portion and an offset portion over the base portion; forming a first ball bond of a first internal interconnect over the offset portion; and encapsulating the integrated circuit device structure, the flex bump, and the first internal interconnect.

Certain embodiments of the invention have other aspects in addition to or in place of those mentioned above. The aspects will become apparent to those skilled in the art from a reading of the following detailed description when taken with reference to the accompanying drawings.

BEST MODE FOR CARRYING OUT THE INVENTION

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail. Likewise, the drawings showing embodiments of the system are semi-diagrammatic and not to scale and, particularly, some of the dimensions are for the clarity of presentation and are shown greatly exaggerated in the drawing FIGs. Generally, the invention can be operated in any orientation.

In addition, where multiple embodiments are disclosed and described having some features in common, for clarity and ease of illustration, description, and comprehension thereof, similar and like features one to another will ordinarily be described with like reference numerals. The embodiments have been numbered first embodiment, second embodiment, etc. as a matter of descriptive convenience and are not intended to have any other significance or provide limitations for the present invention.

For expository purposes, the term "horizontal" as used herein is defined as a plane parallel to the plane or surface of the integrated circuit, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane. The term "on" means there is direct contact among elements. The term "processing" as used herein includes deposition of material, patterning, exposure, development, etching, cleaning, molding, and/or removal of the material or as required in forming a described structure. The term "system" as used herein means and refers to the method and to the apparatus of the present invention in accordance with the context in which the term is used. The term "integrated circuit device structure" as used herein means and refers to embedded structures of the present invention including an integrated circuit die, an embedded structure having an integrated circuit, or an embedded structure for providing redistribution of electrical connections with an integrated circuit.

Figure 1:
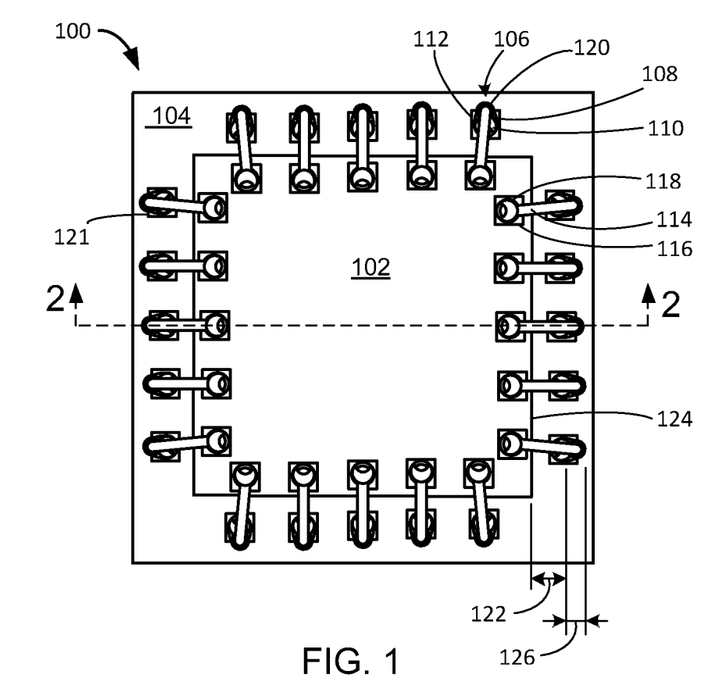
FIG. 1 is a plan view of an integrated circuit package system in a first embodiment of the present invention.

Referring now to FIG. 1, therein is shown a plan view of an integrated circuit package system 100 in a first embodiment of the present invention. The plan view depicts a first integrated circuit device structure 102, such as an integrated circuit die, over a second integrated circuit device structure 104 without a cover. As examples, the second integrated circuit device structure 104 may be a package carrier, a printed circuit board, or another first integrated circuit device structure.

Flex bumps 106 having both an offset portion 108 and a base portion 110 are preferably over contact pads 112, such as a bond pads or terminal pads, of the second integrated circuit device structure 104. Internal interconnects 114, such as bond wires or stitch bond wires, preferably connect the flex bumps 106 and bond pads 116 of the first integrated circuit device structure 102 with stitch bonds 118 over the bond pads 116 and ball bonds 120 over the offset portion 108 of the flex bumps 106. The offset portion 108 extends horizontally beyond a vertical line defined by a perimeter side 121 of the bond pads 116.

As the market drive for miniaturization continues, the space within the integrated circuit package system 100 shrinks reducing a contact distance 122 between the contact pads 112 and edges 124 of the first integrated circuit device structure 102. The flex bumps 106 preferably provide an offset distance 126 beyond the contact distance 122. The offset distance 126 with the contact distance 122 preferably provides the clearance needed for wire bonding and preventing damage to the first integrated circuit device structure 102.

Figure 2:
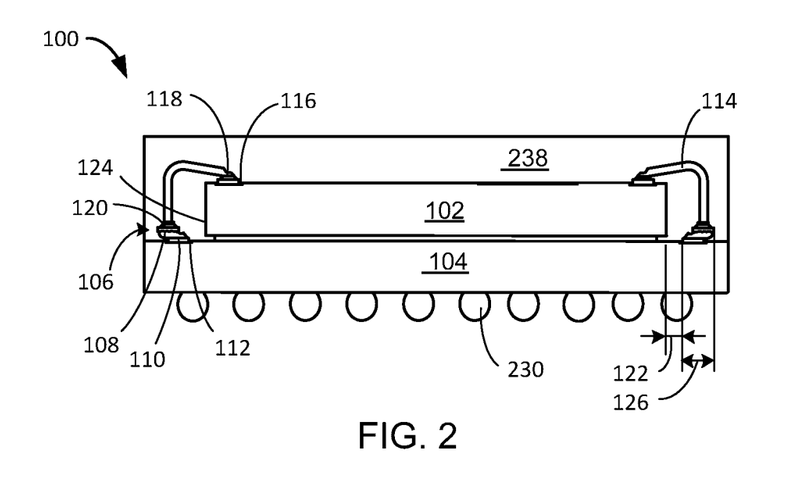
FIG. 2 is a cross-sectional view of the integrated circuit package system along line 2-2 of FIG. 1.

Referring now to FIG. 2, therein is shown a cross-sectional view of the integrated circuit package system 100 along line 2-2 of FIG. 1. The cross-sectional view depicts the first integrated circuit device structure 102 mounted over the second integrated circuit device structure 104. The contact pads 112 and the edges 124 of the first integrated circuit device structure 102 are separated by the contact distance 122.

The flex bumps 106 include the offset portion 108 over and overhanging the base portion 110. The offset portion 108 is preferably in a fold-over configuration. The base portion 110 is preferably over the contact pads 112. The offset portion 108 provides the offset distance 126 beyond the contact distance 122. The ball bonds 120 of the internal interconnects 114 preferably attach to the offset portion 108 of the flex bumps 106. The stitch bonds 118 of the internal interconnects 114 are preferably over the bond pads 116 of the first integrated circuit device structure 102.

An encapsulation 228, such as an epoxy molding compound, cover the first integrated circuit device structure 102, the flex bumps 106, and the internal interconnects 114 over the second integrated circuit device structure 104. External interconnects 230, such as solder balls, connect under the second integrated circuit device structure 104.

For illustrative purposes, the second integrated circuit device structure 104 is described as a package carrier, although it is understood that the second integrated circuit device structure 104 may be a different type of structure. For example, the second integrated circuit device structure 104 may be another first integrated circuit device structure under the first integrated circuit device structure 102 forming a stacked configuration of integrated circuits. In this example, the contact pads 112 are bond pads for the other first integrated circuit device structure and both may be preferably encapsulated in the encapsulation 228.

Figure 3:
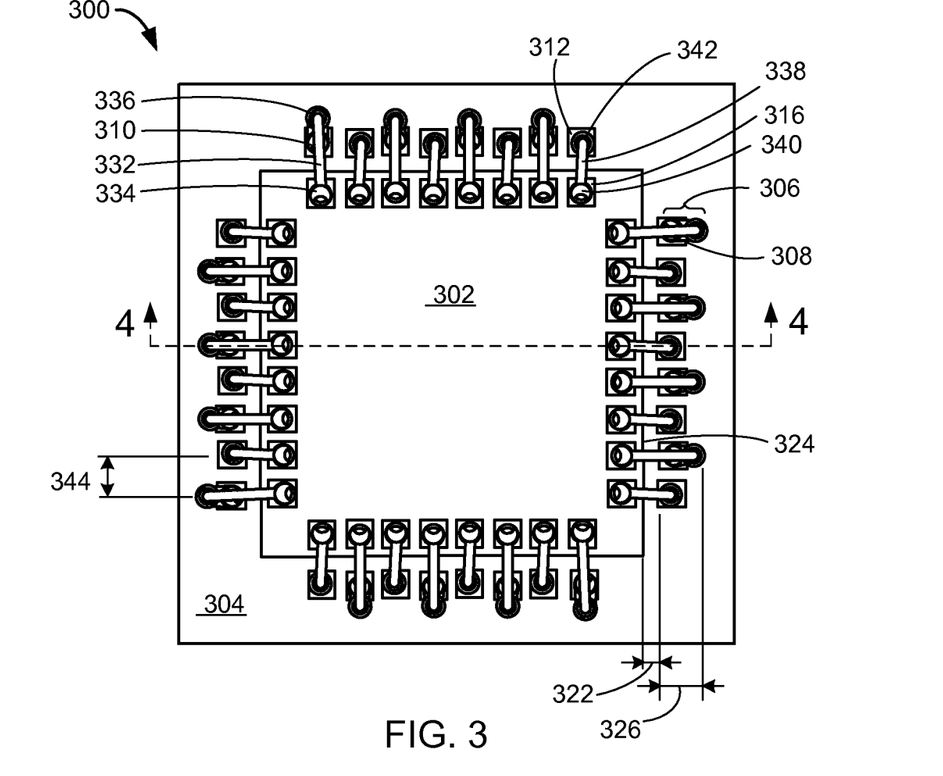
FIG. 3 is a plan view of an integrated circuit package system in a second embodiment of the present invention.

Referring now to FIG. 3, therein is shown a plan view of an integrated circuit package system 300 in a second embodiment of the present invention. The plan view depicts a first integrated circuit device structure 302, such as an integrated circuit die, over a second integrated circuit device structure 304 without a cover. As examples, the second integrated circuit device structure 304 may be a package carrier, a printed circuit board, or another first integrated circuit device structure. Flex bumps 306 having both an offset portion 308 and a base portion 310 are preferably over a portion of contact pads 312, such as a bond pads, of the second integrated circuit device structure 304.

First internal interconnects 332, such as bond wires or stitch bond wires, preferably connect the offset portion 308 of the flex bumps 306 and a predetermined selection of bond pads 316 of the first integrated circuit device structure 302. First stitch bonds 334 of the first internal interconnects 332 are preferably over the bond pads 316. First ball bonds 336 of the first internal interconnects 332 are preferably over the offset portion 308 of the flex bumps 306.

Second internal interconnects 338, such as bond wires or stitch bond wires, preferably connect the other portion of the contact pads 312 and a different predetermined selection of the bond pads 316. Second stitch bonds 340 of the second internal interconnects 338 are preferably over the bond pads 316. Second ball bonds 342 of the second internal interconnects 338 are preferably over the contact pads 312.

The flex bumps 306 are preferably over alternating positions of the contact pads 312 such that the first internal interconnects 332 and the second internal interconnects 338 preferably connect with the contact pads 312 in a staggered configuration. For illustrative purposes, the flex bumps 306 are shown over alternating positions of the contact pads 312, although it is understood that the flex bumps 306 may be formed in other configurations, such as not alternating between adjacent positions. The contact pads 312 and edges 324 of the first integrated circuit device structure 302 are preferably separated by a contact distance 322. The flex bumps 306 preferably provide an offset distance 326 beyond the contact distance 322. The offset portion 308 extends beyond the bond pads 316 and the offset distance 326 preferably increases the ball bondable surface area by three times.

As the market drive for miniaturization continues, the number of input/outputs (I/O) for the integrated circuit package system 300 does not necessarily reduce. The miniaturization may reduce a contact pitch 344 between the contact pads 312. The flex bumps 306 in alternating locations of the contact pads 312 preferably provide the I/O density for the integrated circuit package system 300.

Figure 4:
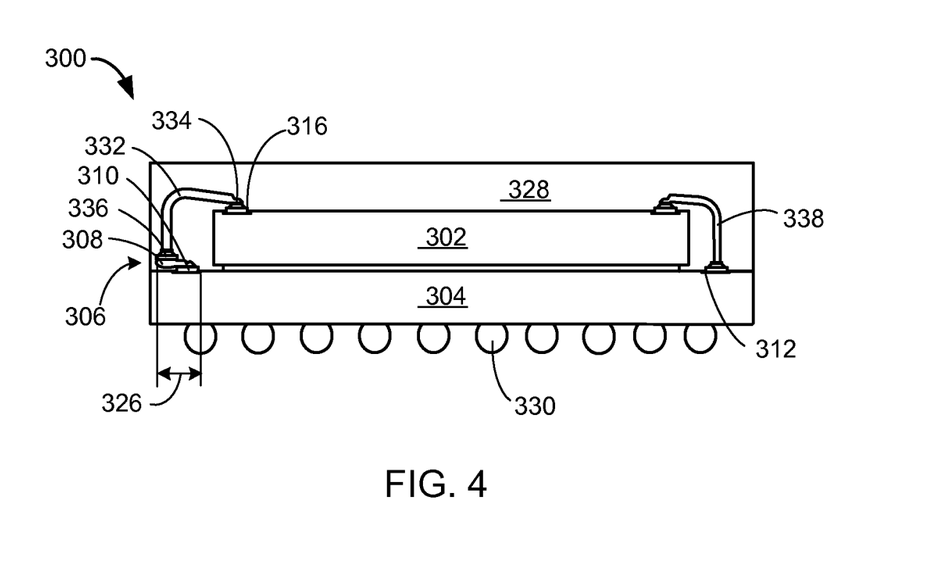
FIG. 4 is a cross-sectional view of the integrated circuit package system along line 4-4 of FIG. 3.

Referring now to FIG. 4 therein is shown a cross-sectional view of the integrated circuit package system 300 along line 4-4 of FIG. 3. The cross-sectional view depicts the first integrated circuit device structure 302 mounted over the second integrated circuit device structure 304. The first internal interconnects 332 preferably connect the flex bumps 306 and a predetermined selection of the bond pads 316 of the first integrated circuit device structure 302. The second internal interconnects 338 preferably connect the other portion of the contact pads 312 and a different predetermined selection of the bond pads 316.

The flex bumps 306 include the offset portion 308 over and overhanging the base portion 310. The offset portion 308 is preferably in a fold-over configuration. The base portion 310 is preferably over the contact pads 312. The offset portion 308 provides the offset distance 326. The first ball bonds 336 of the first internal interconnects 332 preferably attach to the offset portion 308 of the flex bumps 306. The first stitch bonds 334 of the first internal interconnects 332 are preferably over the bond pads 316 of the first integrated circuit device structure 302.

An encapsulation 328, such as an epoxy molding compound, covers the first integrated circuit device structure 302, the flex bumps 306, the first internal interconnects 332, and the second internal interconnects 338 over the second integrated circuit device structure 304. External interconnects 330, such as solder balls, connect under the second integrated circuit device structure 304.

For illustrative purposes, the second integrated circuit device structure 304 is described as a package carrier, although it is understood that the second integrated circuit device structure 304 may be a different type of structure. For example, the second integrated circuit device structure 304 may be another first integrated circuit device structure under the first integrated circuit device structure 302 forming a stacked configuration of integrated circuits. In this example, the contact pads 312 are bond pads for the other first integrated circuit device structure and both may be preferably encapsulated in the encapsulation 328.

Figure 5:
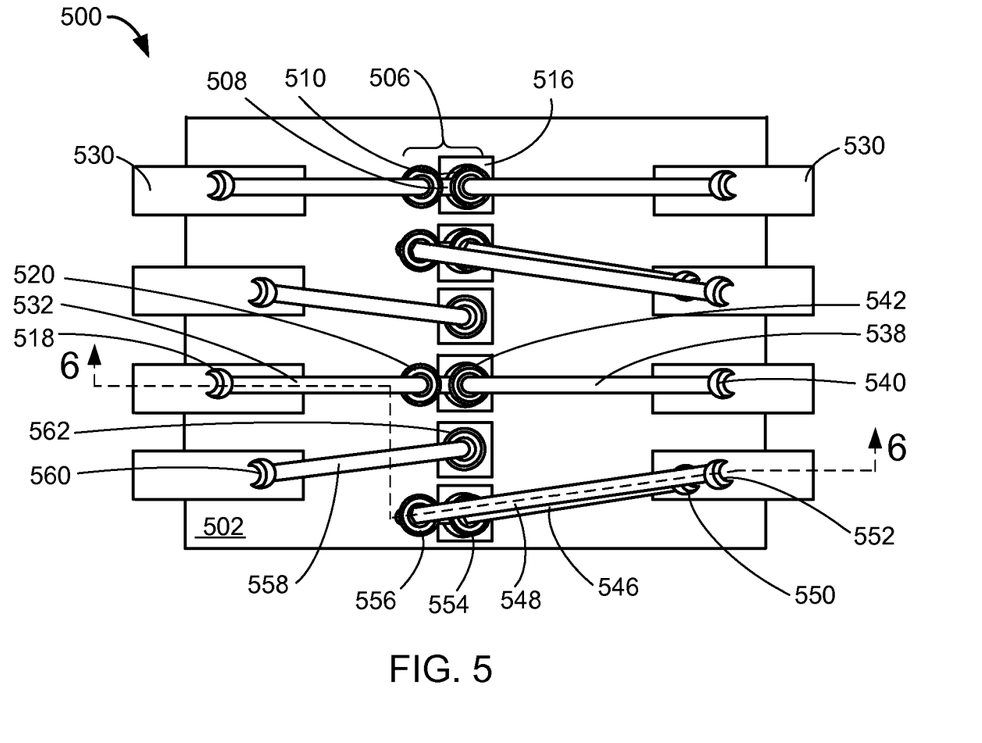
FIG. 5 is a plan view of an integrated circuit package system in a third embodiment of the present invention.

Referring now to FIG. 5, therein is shown a plan view of an integrated circuit package system 500 in a third embodiment of the present invention. The plan view depicts an integrated circuit device structure 502, such as an integrated circuit die, under an interior portion of external interconnects 530, such as leads, without a cover. Flex bumps 506 having both an offset portion 508 and a base portion 510 are preferably over a predetermined selection of bond pads 516 of the integrated circuit device structure 502.

First internal interconnects 532, such as bond wires or stitch bond wires, preferably connect a predetermined selection of the flex bumps 506 over the offset portion 508 and a predetermined selection of the external interconnects 530. First stitch bonds 518 of the first internal interconnects 532 are preferably over the external interconnects 530. First ball bonds 520 of the first internal interconnects 532 are preferably over the offset portion 508 of the flex bumps 506.

Second internal interconnects 538, such as bond wires or stitch bond wires, preferably connect to the same selection of the flex bumps 506 connected to the first internal interconnects 532. The other end of the second internal interconnects 538 preferably connect to the external interconnects 530 along an opposing side of the integrated circuit device structure 502 as those connected to the first internal interconnects 532. Second stitch bonds 540 of the second internal interconnects 538 are preferably over the external interconnects 530. Second ball bonds 542 of the second internal interconnects 538 are preferably over the base portion 510 of the flex bumps 506.

The flex bumps 506 with the first internal interconnects 532 and the second internal interconnects 538 preferably provide a redistribution structure for connecting the external interconnects 530 to each other and to increase the fan-in or fan-out to the bond pads 516. This connection structure may serve other functions. For example, this connection structure may serve to provide redundant fan-in or fan-out for fault tolerant applications. Another example, this connections structure may serve to provide connection options to the next system level (not shown) where one is connected and the other is not.

Third internal interconnects 546, such as bond wires or stitch bond wires, and fourth internal interconnects 548, such as bond wires or stitch bond wires, preferably connect to the same predetermined selection of both the external interconnects 530 and the flex bumps 506 forming double connections for increased current source or sink capability. Third stitch bonds 550 of the third internal interconnects 546 preferably connect to the external interconnects 530. Fourth stitch bonds 552 of the fourth internal interconnects 548 preferably connect to the external interconnects 530.

Third ball bonds 554 of the third internal interconnects 546 preferably connect to a predetermined selection of the flex bumps 506 over the base portion 510. Fourth balls bonds 556 of the fourth internal interconnects 548 preferably connect to the flex bumps 506 over the offset portion 508.

Fifth internal interconnects 558, such as bond wires or stitch bond wires, preferably connect a predetermined selection of the external interconnects 530 and the bond pads 516 without the flex bumps 506. Fifth stitch bonds 560 of the fifth internal interconnects 558 preferably connect to the external interconnects 530. Fifth ball bonds 562 of the fifth internal interconnects 558 preferably connect to the bond pads 516. The fifth internal interconnects 558 are preferably staggered with the bond pads 516 having the flex bumps 506 thereover.

Figure 6:
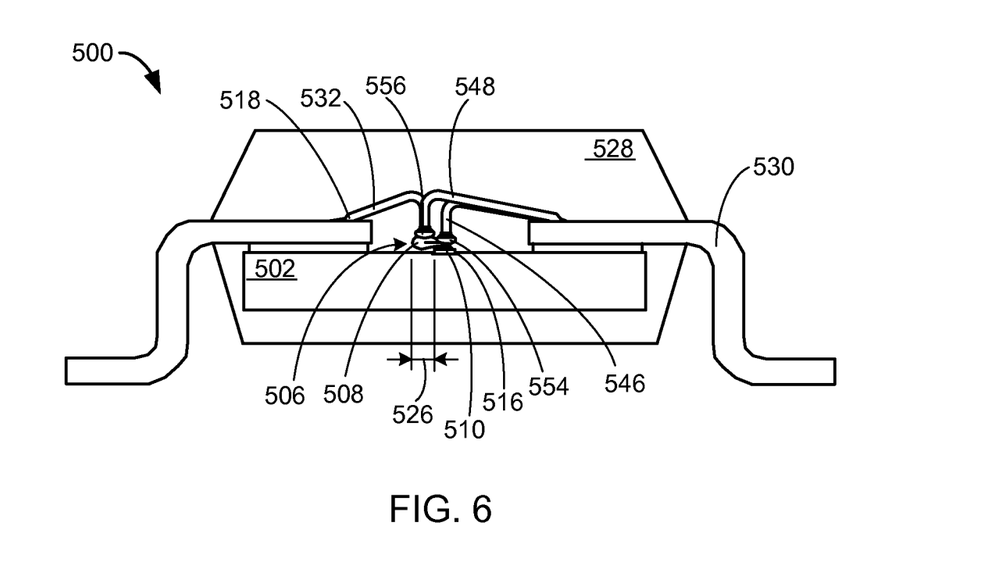
FIG. 6 is a cross-sectional view of the integrated circuit package system along line 6-6 of FIG. 5.

Referring now to FIG. 6, therein is shown a cross-sectional view of the integrated circuit package system 500 along line 6-6 of FIG. 5. The cross-sectional view depicts the integrated circuit device structure 502 mounted under the external interconnects 530. The flex bumps 506 include the offset portion 508 over and overhanging the base portion 510. The offset portion 508 is preferably in a fold-over configuration. The base portion 510 is preferably over the bond pads 516. The offset portion 508 provides an offset distance 526 from a top portion of the base portion 510. The offset portion 508 with the offset distance 526 preferably increases the ball bondable surface area by three times.

The third ball bonds 554 of the third internal interconnects 546 preferably connect over the base portion 510 of the flex bumps 506. The fourth balls bonds 556 of the fourth internal interconnects 548 preferably connect over the offset portion 508 of the flex bumps 506 and not over the base portion 510. The third internal interconnects 546 and the fourth internal interconnects 548 preferably connect over the same predetermined selection of the external interconnects 530.

The first ball bonds 520 of FIG. 5 of the first internal interconnects 532 preferably attach to the offset portion 508 of the flex bumps 506 that are not connected with the fourth internal interconnects 548. The first stitch bonds 518 of the first internal interconnects 532 are preferably over the external interconnects 530 that are not connected to the fourth internal interconnects 548.

An encapsulation 528, such as an epoxy molding compound, cover the integrated circuit device structure 502, the flex bumps 506, the first internal interconnects 532, the second internal interconnects 538 of FIG. 5, the third internal interconnects 546, the fourth internal interconnects 548, and the fifth internal interconnects 558 of FIG. 5. The encapsulation 528 partially covers the external interconnects 530.

Figure 7:
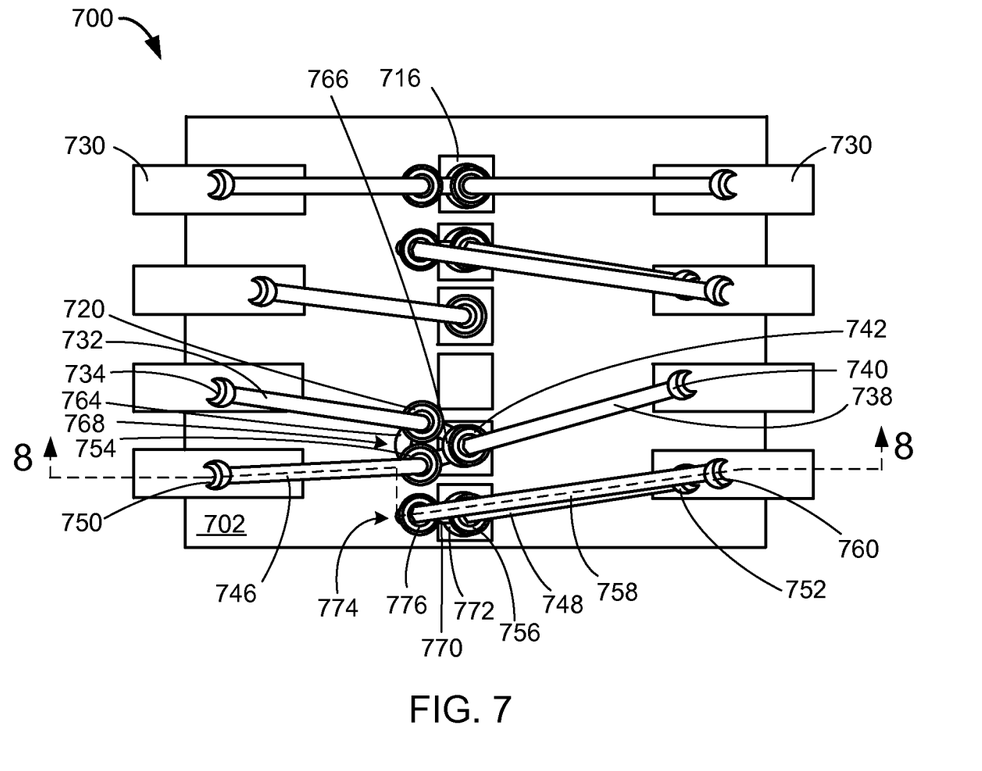
FIG. 7 is a plan view of an integrated circuit package system in a fourth embodiment of the present invention.

Referring now to FIG. 7, therein is shown a plan view of an integrated circuit package system 700 in a fourth embodiment of the present invention. The plan view depicts an integrated circuit device structure 702, such as an integrated circuit die, under an interior portion of external interconnects 730, such as leads, without a cover.

First flex bumps 768 having both a first offset portion 764 and a first base portion 766 are preferably over a predetermined selection of bond pads 716 of the integrated circuit device structure 702. The first offset portion 764 is preferably in a loop configuration preferably increasing the ball bondable surface area by six times.

First internal interconnects 732, such as bond wires or stitch bond wires, preferably connect the first offset portion 764 of the first flex bumps 768 and a predetermined selection of the external interconnects 730. First stitch bonds 734 of the first internal interconnects 732 are preferably over the external interconnects 730. First ball bonds 720 of the first internal interconnects 732 are preferably over the first offset portion 764 of the first flex bumps 768.

Second internal interconnects 738, such as bond wires or stitch bond wires, preferably connect the first flex bumps 768 and the external interconnects 730 along an opposing side of the integrated circuit device structure 702 as those connected to the first internal interconnects 732. Second stitch bonds 740 of the second internal interconnects 738 are preferably over the external interconnects 730. Second ball bonds 742 of the second internal interconnects 738 are preferably over the first base portion 766 of the first flex bumps 768.

Third internal interconnects 746, such as bond wires or stitch bond wires, preferably connect the first offset portion 764 of the first flex bumps 768 and a predetermined selection of the external interconnects 730 adjacent to the external interconnects 730 connected with the first internal interconnects 732. Third stitch bonds 750 of the third internal interconnects 746 are preferably over the external interconnects 730. Third ball bonds 754 of the third internal interconnects 746 are preferably over the first offset portion 764 of the first flex bumps 768.

The first flex bumps 768 with the first internal interconnects 732, the second internal interconnects 738, and the third internal interconnects 746 preferably provide a redistribution structure for connecting the external interconnects 730 to each other and to increase the fan-in or fan-out to the bond pads 716 with this connection structure. This connection structure may serve other functions. For example, this connection structure may serve to provide redundant fan-in or fan-out for fault tolerant applications. Another example, this connections structure may serve to provide connection options to the next system level (not shown) where one is connected and the other is not.

Second flex bumps 774 having both a second offset portion 770 and a second base portion 772 are preferably over a predetermined selection of the bond pads 716 of the integrated circuit device structure 702. The second offset portion 770 is preferably in a fold-over configuration.

Fourth internal interconnects 748, such as bond wires or stitch bond wires, and fifth internal interconnects 758, such as bond wires or stitch bond wires, preferably connect to the same predetermined selection of the external interconnects 730 and the second flex bumps 774 forming double connections for increased current source or sink capability. Fourth stitch bonds 752 of the fourth internal interconnects 748 preferably connect to the external interconnects 730. Fifth stitch bonds 760 of the fifth internal interconnects 758 preferably connect to the external interconnects 730.

Fourth ball bonds 756 of the fourth internal interconnects 748 preferably connect over the second base portion 772 of the second flex bumps 774. Fifth balls bonds 776 of the fifth internal interconnects 758 preferably connect over the second offset portion 770 of the second flex bumps 774.

Similarly, the second flex bumps 774 with the first internal interconnects 732 and the second internal interconnects 738 preferably provide a redistribution structure for connecting the external interconnects 730 to each other and to increase the fan-in or fan-out to the bond pads 716 with this connection structure. This connection structure may serve other functions. For example, this connection structure may serve to provide redundant fan-in or fan-out for fault tolerant applications. Another example, this connections structure may serve to provide connection options to the next system level (not shown) where one is connected and the other is not.

Figure 8:
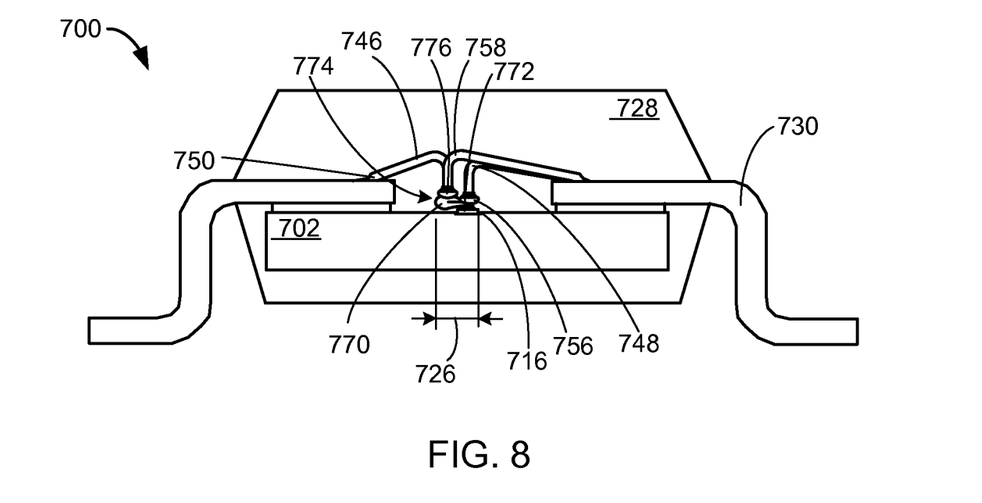
FIG. 8 is a cross-sectional view of the integrated circuit package system along line 8-8 of FIG. 7.

Referring now to FIG. 8, therein is shown a cross-sectional view of the integrated circuit package system 700 along line 8-8 of FIG. 7. The cross-sectional view depicts the integrated circuit device structure 702 mounted under the external interconnects 730. The second flex bumps 774 include the second offset portion 770 over the second base portion 772. The second offset portion 770 is preferably in a fold-over configuration. The second base portion 772 is preferably over the bond pads 716. The second offset portion 770 provides an offset distance 726 from a top portion of the second base portion 772. The second offset portion 770 with the offset distance 726 preferably increases the ball bondable surface area by three times.

The fourth ball bonds 756 of the fourth internal interconnects 748 preferably connect over the second base portion 772 of the second flex bumps 774. The fifth balls bonds 776 of the fifth internal interconnects 758 preferably connect over the second offset portion 770 of the second flex bumps 774 and not over the second base portion 772. The fourth internal interconnects 748 and the fifth internal interconnects 758 preferably connect over the same predetermined selection of the external interconnects 730.

The third ball bonds 754 of FIG. 7 of the third internal interconnects 746 preferably attach to the first offset portion 764 of FIG. 7 of the first flex bumps 768 of FIG. 7. The third stitch bonds 750 of the third internal interconnects 746 are preferably over the external interconnects 730.

An encapsulation 728, such as an epoxy molding compound, cover the integrated circuit device structure 702, the first flex bumps 768, the second flex bumps 774, the first internal interconnects 732 of FIG. 7, the second internal interconnects 738 of FIG. 7, the third internal interconnects 746, the fourth internal interconnects 748, and the fifth internal interconnects 758. The encapsulation 728 partially covers the external interconnects 730.

Figure 9:
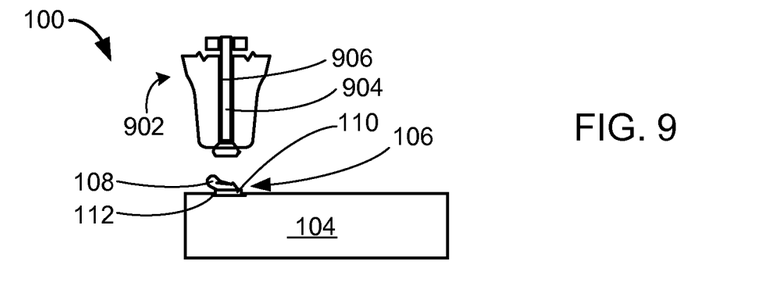
FIG. 9 is a cross-sectional view of a portion of the integrated circuit package system of FIG. 1 in a forming phase of the flex bumps.

Referring now to FIG. 9, therein is shown a cross-sectional view of a portion of the integrated circuit package system 100 of FIG. 1 in a forming phase of the flex bumps 106. The flex bumps 106 are preferably formed over the contact pads 112 of the second integrated circuit device structure 104. The flex bumps 106 may be formed in a number of ways.

For example, an internal interconnect apparatus 902, such as a cantilever, having a wire 904 within a barrel 906 of the internal interconnect apparatus 902, may be used to form the base portion 110, such as a ball bond, over the contact pads 112. The internal interconnect apparatus 902 may preferably be elevated over the base portion 110 and moved laterally away from the base portion 110 and moved back towards the base portion 110. The internal interconnect apparatus 902 may clamp closed to cut the wire 904 from the internal interconnect apparatus 902 forming the offset portion 108 in a fold-over configuration over the base portion 110.

Figure 10:
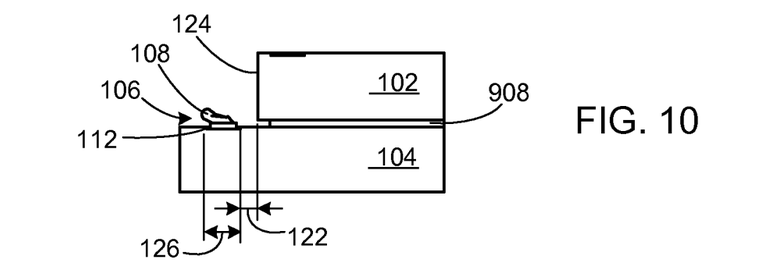
FIG. 10 is the structure of FIG. 9 in a mounting phase of the integrated circuit device.

Referring now to FIG. 10, therein is shown the structure of FIG. 9 in a mounting phase of the first integrated circuit device structure 102. The first integrated circuit device structure 102 preferably mounts over the second integrated circuit device structure 104 with an adhesive 908, such as a die-attach adhesive. The edges 124 of the first integrated circuit device structure 102 are preferably separated from the contact pads 112 by the contact distance 122. The offset portion 108 of the flex bumps 106 preferably provides the offset distance 126 beyond the contact distance 122.

Figure 11:
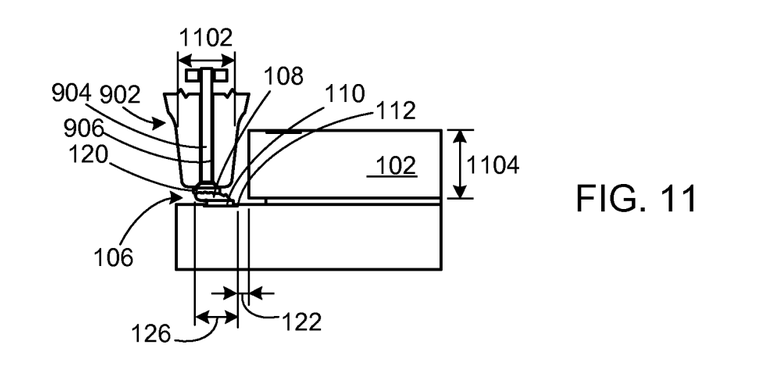
FIG. 11 is the structure of FIG. 10 in a connecting phase over the flex bumps.

Referring now to FIG. 11, therein is shown the structure of FIG. 10 in a connecting phase over the flex bumps 106. The internal interconnect apparatus 902 has a nozzle width 1102 at a device height 1104 of the first integrated circuit device structure 102. The nozzle width 1102 is greater than the contact distance 122. The offset portion 108 of the flex bumps 106 preferably provides the offset distance 126 in addition to the contact distance 122 preventing damage to the first integrated circuit device structure 102, the internal interconnect apparatus 902, or a combination thereof. Another example of a problem prevented by the flex bumps 106 is forming contacts partially on the contact pads 112 resulting in poor electrical contact, poor electrical performance, poor manufacturing yield, and poor reliability.

The internal interconnect apparatus 902 forms one of the ball bonds 120 over the offset portion 108 and not centered over the base portion 110. The wire 904 in the barrel 906 is preferably attached to one of the ball bonds 120.

Figure 12:
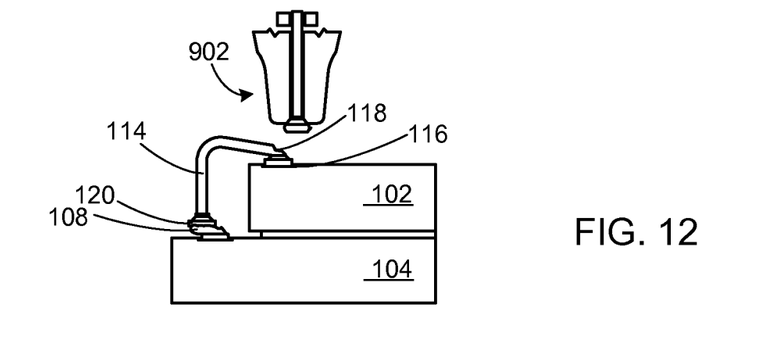
FIG. 12 is the structure of FIG. 11 in a forming phase of the internal interconnects.

Referring now to FIG. 12, therein is shown the structure of FIG. 11 in a forming phase of the internal interconnects 114. The internal interconnect apparatus 902 of FIG. 11 moves from one of the ball bonds 120 over the offset portion 108 to a position over the bond pads 116 for forming one of the stitch bonds 118.

The structure having the internal interconnects 114 connect between the second integrated circuit device structure 104 and the first integrated circuit device structure 102 preferably undergo further processing. For example, the structure having the internal interconnects 114 may undergo an encapsulating process for forming the encapsulation 228 of FIG. 2.

Figure 13:
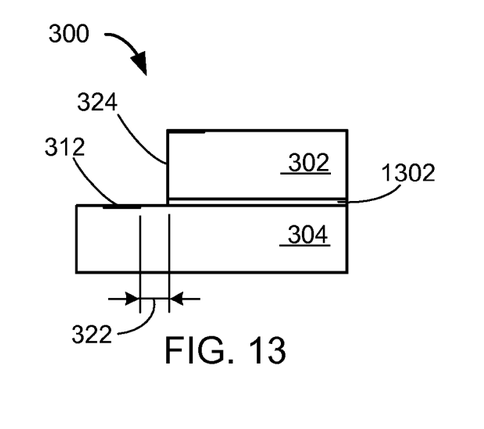
FIG. 13 is a cross-sectional view of a portion of the integrated circuit package system of FIG. 3 in a mounting phase of the integrated circuit device.

Referring now to FIG. 13, therein is shown a cross-sectional view of a portion of the integrated circuit package system 300 of FIG. 3 in a mounting phase of the first integrated circuit device structure 302. The first integrated circuit device structure 302 preferably mounts over the second integrated circuit device structure 304 with an adhesive 1302, such as a die-attach adhesive. The edges 324 of the first integrated circuit device structure 302 are preferably separated from the contact pads 312 by the contact distance 322.

Figure 14:
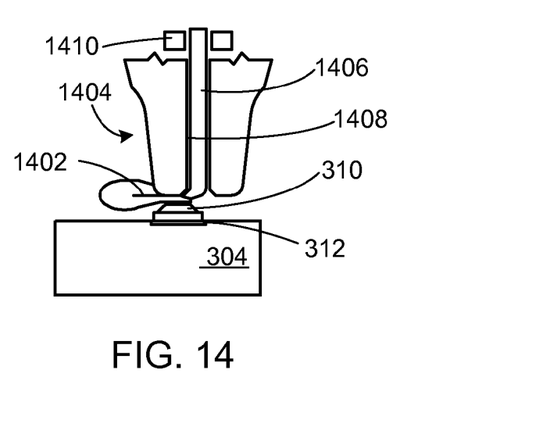
FIG. 14 is a cross-sectional view of a portion of the integrated circuit package system of FIG. 3 in a forming phase of the fold.

Referring now to FIG. 14, therein is shown a cross-sectional view of a portion of the integrated circuit package system 300 of FIG. 3 in a forming phase of a fold 1402. An internal interconnect apparatus 1404, such as a cantilever, includes a wire 1406 within a barrel 1408 of the internal interconnect apparatus 1404. A clamp 1410 of the internal interconnect apparatus 1404 allows the flow of the wire 1406 through the barrel 1408 with the clamp 1410 preferably in an opened position. The open position preferably has the clamp 1410 not in contact with the wire 1406. The clamp 1410 restricts flow of the wire 1406 through the barrel 1408 with the clamp 1410 preferably in a closed position. The closed position preferably has the clamp 1410 in contact with the wire 1406.

The internal interconnect apparatus 1404 preferably forms the base portion 310, such as a ball bond, over the contact pads 312. The internal interconnect apparatus 1404 with the clamp 1410 in the opened position may preferably be moved laterally away from the base portion 310 and moved back towards the base portion 310 forming the fold 1402 over the base portion 310 and over the second integrated circuit device structure 304.

Figure 15:
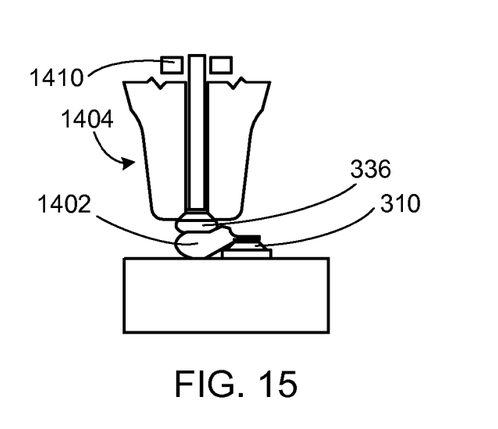
FIG. 15 is the structure of FIG. 14 in a connecting phase over the fold.

Referring now to FIG. 15, therein is shown the structure of FIG. 14 in a connecting phase over the fold 1402. The internal interconnect apparatus 1404 with the clamp 1410 in the opened position is preferably moved from over the base portion 310 to towards the end of the fold 1402 with one of the first ball bonds 336 over the fold 1402. The fold 1402 is attached to the base portion 310.

Figure 16:
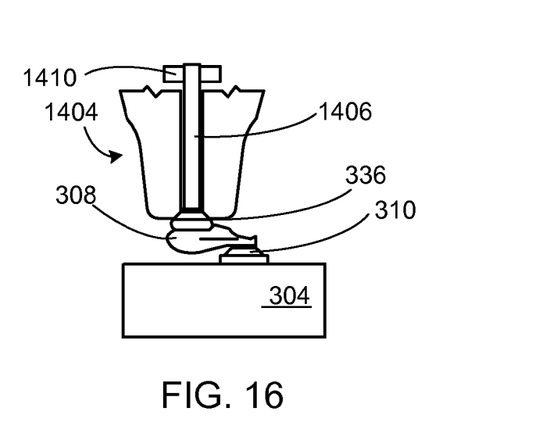
FIG. 16 is the structure of FIG. 15 in a forming phase of the offset portion.

Referring now to FIG. 16, therein is shown the structure of FIG. 15 in a forming phase of the offset portion 308. With the clamp 1410 in the closed position and the wire 1406 attached to the fold 1402 of FIG. 15 with one of the first ball bonds 336, the internal interconnect apparatus 1404 is preferably elevated such that the offset portion 308 is not in contact with the second integrated circuit device structure 304.

For illustrative purposes, the fold 1402 is described as lifted to avoid contact the second integrated circuit device structure 304, although it is understood that the offset portion 308 may be on the second integrated circuit device structure 304. For example, the offset portion 308 may have a substantial size and weight that the contact with the second integrated circuit device structure 304 prevents the offset portion 308 separating from the base portion 310.

Another example, the number of connection force on the offset portion 308 may cause the offset portion 308 to move downwards potentially causing separation between the offset portion 308 and the base portion 310. The offset portion 308 in contact with the second integrated circuit device structure 304 allows a counter forces to the downward force described previously, preventing separation between the offset portion 308 and the base portion 310.

Figure 17:
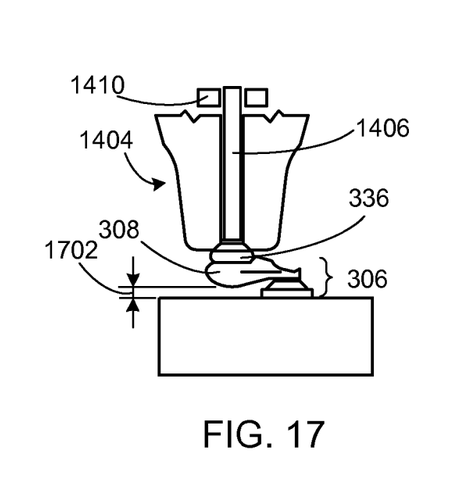
FIG. 17 is the structure of FIG. 16 in a preparing phase of the first internal interconnects.

Referring now to FIG. 17, therein is shown the structure of FIG. 16 in a preparing phase of the first internal interconnects 332 of FIG. 1. With the offset portion 308 at an offset height 1702, the clamp 1410 is preferably in the opened position allowing the wire 1406 to move with one of the first ball bonds 336 preferably attached to the offset portion 308. This allows for a single step bonding from forming the flex bumps 306 to forming the first internal interconnects 332 without cutting the wire 1406 in the internal interconnect apparatus 1404.

Figure 18:
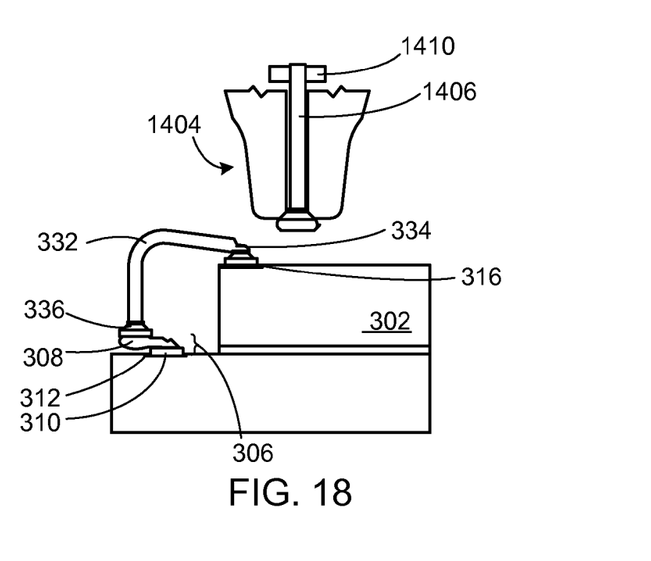
FIG. 18 is the structure of FIG. 17 in a forming phase of the first internal interconnects and the second internal interconnects.

Referring now to FIG. 18, therein is shown the structure of FIG. 17 in a forming phase of the first internal interconnects 332 and the second internal interconnects 338. As described earlier, the flex bumps 306 are preferably formed at predetermined alternating selection of the contact pads 312. The internal interconnect apparatus 1404 of FIG. 17 moves from one of the first ball bonds 336 over the offset portion 308 to a position over the bond pads 316 for forming one of the first stitch bonds 334.

The internal interconnect apparatus 1404 preferably closes the clamp 1410 to cut the wire 1406 from the internal interconnect apparatus 1404. The internal interconnect apparatus 1404 preferably move to the bond pads 316 for the second internal interconnects 338 of FIG. 3 for forming the second ball bonds 342 of FIG. 3. The internal interconnect apparatus 1404 then moves over the first integrated circuit device structure 302 for forming one of the second stitch bonds 340 of FIG. 3.

Figure 19:
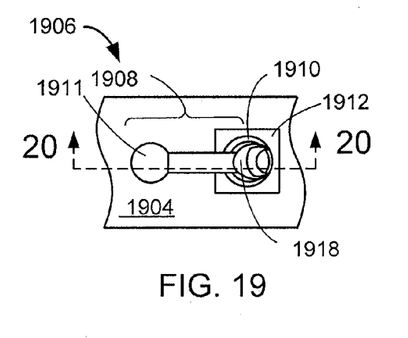
FIG. 19 is a top view of a flex bump in a fifth embodiment of the present invention.

Referring now to FIG. 19, therein is shown a top view of a flex bump 1906 in a fifth embodiment of the present invention. The flex bump 1906 may be used in any of the embodiments described earlier. The flex bump 1906 includes a base portion 1910, such as a ball bond, over a pad 1912, such as a contact pad or a bond pad, of an integrated circuit device structure 1904, such as a carrier or an integrated circuit. The flex bump 1906 also includes an offset portion 1908 connected with the base portion 1910. The offset portion 1908 preferably extends from the base portion 1910 providing an enlarged end 1911 in a spherical geometric configuration. A stitch bond 1918 connects the offset portion 1908 and the base portion 1910.

Figure 20:
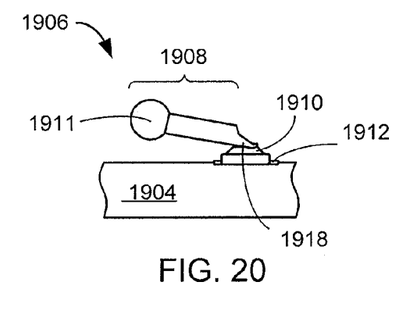
FIG. 20 is a cross-sectional view of the flex bump along line 20-20 of FIG. 19.

Referring now to FIG. 20, therein is shown a cross-sectional view of the flex bump 1906 along line 20-20 of FIG. 19. The flex bump 1906 includes the offset portion 1908 extending preferably in an incline from the base portion 1910. The base portion 1910 is preferably over the pad 1912. The enlarged end 1911 of the offset portion 1908 is preferably above the integrated circuit device structure 1904. The stitch bond 1918 connects the offset portion 1908 and the base portion 1910.

Figure 21:
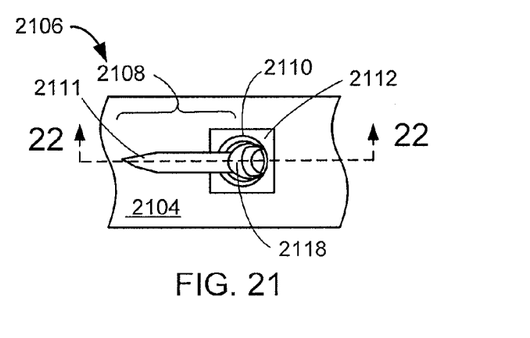
FIG. 21 is a top view of a flex bump in a sixth embodiment of the present invention.

Referring now to FIG. 21, therein is shown a top view of a flex bump 2106 in a sixth embodiment of the present invention. The flex bump 2106 may be used in any of the embodiments described earlier. The flex bump 2106 includes a base portion 2110, such as a ball bond, over a pad 2112, such as a contact pad or a bond pad, of an integrated circuit device structure 2104, such as a carrier or an integrated circuit. The flex bump 2106 also includes an offset portion 2108 connected with the base portion 2110. The offset portion 2108 preferably extends from the base portion 2110 providing a tapered end 2111. A stitch bond 2118 connects the offset portion 2108 and the base portion 2110.

Figure 22:
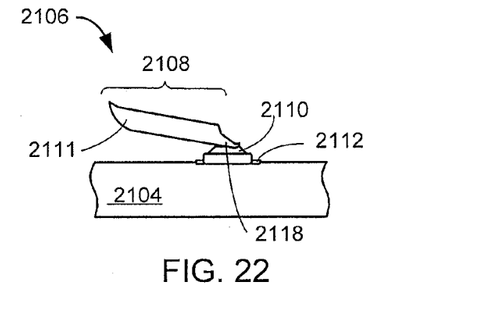
FIG. 22 is a cross-sectional view of the flex bump along line 22-22 of FIG. 21.

Referring now to FIG. 22, therein is shown a cross-sectional view of the flex bump 2106 along line 22-22 of FIG. 21. The flex bump 2106 includes the offset portion 2108 extending preferably in an incline from the base portion 2110. The base portion 2110 is preferably over the pad 2112. The tapered end 2111 of the offset portion 2108 is preferably above the integrated circuit device structure 2104. The stitch bond 2118 connects the offset portion 2108 and the base portion 2110.

Figure 23:
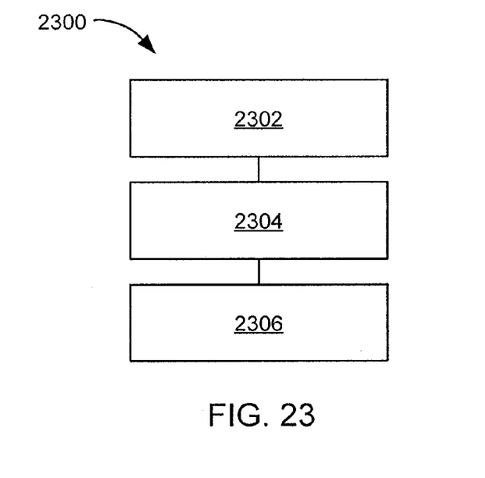
FIG. 23 is a flow chart of an integrated circuit package system for manufacturing the integrated circuit package system in an embodiment of the present invention.

Referring now to FIG. 23, therein is shown a flow chart of an integrated circuit package system 2300 for manufacturing the integrated circuit package system 100 in an embodiment of the present invention. The system 2300 includes forming a flex bump over an integrated circuit device structure, the flex bump having both a base portion and an offset portion over the base portion in a block 2302; forming a first ball bond of a first internal interconnect over the offset portion in a block 2304; and encapsulating the integrated circuit device structure, the flex bump, and the first internal interconnect in a block 2306.

Yet another important aspect of the present invention is that it valuably supports and services the historical trend of reducing costs, simplifying systems, and increasing performance.

These and other valuable aspects of the present invention consequently further the state of the technology to at least the next level.

Thus, it has been discovered that the integrated circuit package system of the present invention furnishes important and heretofore unknown and unavailable solutions, capabilities, and functional aspects for improving yield, increasing reliability, and reducing cost of integrated circuit package system. The resulting processes and configurations are straightforward, cost-effective, uncomplicated, highly versatile, accurate, sensitive, and effective, and can be implemented by adapting known components for ready, efficient, and economical manufacturing, application, and utilization.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method of manufacture of an integrated circuit package system comprising:
   providing an integrated circuit device structure having a bond pad;
   forming a flex bump over the integrated circuit device structure, the flex bump having both a base portion and an offset portion over the base portion, with the offset portion extending horizontally beyond a vertical line defined by a perimeter side of the bond pad;
   forming a first ball bond of a first internal interconnect over the offset portion; mounting a further integrated circuit device structure over the integrated circuit device structure; and wherein forming the flex bump includes:
  forming the base portion over a contact pad of the integrated circuit device structure with the contact pad separated with a contact distance from an edge of the further integrated circuit device structure;
  forming the offset portion having a side portion being at an offset distance beyond the contact distance from the edge;
  forming the first ball bond of the first internal interconnect over the offset portion includes: placing an internal interconnect apparatus having a nozzle width over the offset portion with the nozzle width greater than the contact distance and less than the contact distance plus the offset distance; and
  encapsulating the integrated circuit device structures, the flex bump, and the first internal interconnect.

2. The method as claimed in claim 1 wherein:
forming the flex bump includes:
  forming the offset portion overhanging the base portion; and
further comprising:
  connecting a second internal interconnect and the integrated circuit device structure not over the flex bump with the second internal interconnect adjacent to the first internal interconnect.

3. The method as claimed in claim 1 wherein:
forming the flex bump includes:
  forming the offset portion overhanging the base portion;
forming the first ball bond of the first internal interconnect over the offset portion includes:
  connecting the first internal interconnect over the offset portion overhanging the base portion; and
further comprising:
  connecting a second internal interconnect over the base portion.

4. The method as claimed in claim 1 wherein:
forming the flex bump includes:
  forming the offset portion overhanging the base portion;
forming the first ball bond of the first internal interconnect over the offset portion includes:
  connecting the first internal interconnect over the offset portion overhanging the base portion; and
further comprising:
  connecting a second internal interconnect over the base portion; and
  connecting a third internal interconnect over the offset portion overhanging the base portion.

5. A method of manufacture of an integrated circuit package system comprising:
  providing an integrated circuit device structure having a bond pad;
  forming a flex bump over the integrated circuit device structure, the flex bump including an offset portion over and overhanging a base portion, with the offset portion extending horizontally beyond a vertical line defined by a perimeter side of the bond pad;
  forming a first ball bond of a first internal interconnect over the offset portion overhanging the base portion; mounting a further integrated circuit device structure over the integrated circuit device structure; and
  wherein forming the flex bump includes:
  forming the base portion over a contact pad of the integrated circuit device structure with the contact pad separated with a contact distance from an edge of the further integrated circuit device structure;
  forming the offset portion having a side portion being at an offset distance beyond the contact distance from the edge;
  forming the first ball bond of the first internal interconnect over the offset portion includes: placing an internal interconnect apparatus having a nozzle width over the offset portion with the nozzle width greater than the contact distance and less than the contact distance plus the offset distance; and
  encapsulating the integrated circuit device structures, the flex bump, and the first internal interconnect.

6. The method as claimed in claim 5 wherein:
forming the first ball bond of the first internal interconnect over the offset portion includes:
  connecting the first internal interconnect over the offset portion overhanging the base portion and an external interconnect; and
further comprising:
  connecting a second internal interconnect over the base portion and a further external interconnect.

7. The method as claimed in claim 5 wherein:
forming the first ball bond of the first internal interconnect over the offset portion includes:
  connecting the first internal interconnect over the offset portion overhanging the base portion and an external interconnect; and
further comprising:
  connecting a second internal interconnect over the base portion and the external interconnect connected to the first internal interconnect.

8. The method as claimed in claim 5 wherein forming the flex bump over the integrated circuit device structure includes forming the flex bump over an integrated circuit die or a carrier.

9. The method as claimed in claim 5 wherein forming the flex bump includes forming the offset portion having a fold, a loop, an enlarged end, or a tapered end.

10. An integrated circuit package system comprising:
  an integrated circuit device structure having a bond pad;
  a flex bump over the integrated circuit device structure, the flex bump having both a base portion and an offset portion over the base portion and the offset portion extends horizontally beyond a vertical line defined by a perimeter side of the bond pad;
  a first internal interconnect having a first ball bond with the first ball bond over the offset portion; mounting a further integrated circuit device structure over the integrated circuit device structure; and
  wherein forming the flex bump includes:
  forming the base portion over a contact pad of the integrated circuit device structure with the contact pad separated with a contact distance from an edge of the further integrated circuit device structure;
  forming the offset portion having a side portion being at an offset distance beyond the contact distance from the edge;
  forming the first ball bond of the first internal interconnect over the offset portion includes: placing an internal interconnect apparatus having a nozzle width over the offset portion with the nozzle width greater than the contact distance and less than the contact distance plus the offset distance; and
  an encapsulation over the integrated circuit device structures, the flex bump, and the first internal interconnect.

11. The system as claimed in claim 10 wherein:
the flex bump includes:
the offset portion overhangs over the base portion; and
further comprising:
a second internal interconnect connected with the integrated circuit device structure not over the flex bump with the second internal interconnect adjacent to the first internal interconnect.

12. The system as claimed in claim 10 wherein:
the flex bump includes:
the offset portion overhangs over the base portion;
the first ball bond of the first internal interconnect over the offset portion includes:
the first internal interconnect connected over the offset portion overhanging the base portion; and
further comprising:
a second internal interconnect connected over the base portion.

13. The system as claimed in claim 10 wherein:
the flex bump includes:
the offset portion overhangs over the base portion;
the first ball bond of the first internal interconnect over the offset portion includes:
the first internal interconnect connected over the offset portion overhanging the base portion; and
further comprising:
a second internal interconnect connected over the base portion; and
a third internal interconnect connected over the offset portion overhangs over the base portion.

14. The system as claimed in claim 10 wherein:
the flex bump includes:
the offset portion overhangs over the base portion; and
the first internal interconnect includes:
the first internal interconnect over the offset portion overhanging the base portion.

15. The system as claimed in claim 14 wherein:
the first internal interconnect over the offset portion includes:
the first internal interconnect connected over the offset portion overhanging the base portion and an external interconnect; and
further comprising:
a second internal interconnect connected over the base portion and a further external interconnect.

16. The system as claimed in claim 14 wherein:
the first internal interconnect over the offset portion includes:
the first internal interconnect connected over the offset portion overhanging the base portion and an external interconnect; and
further comprising:
a second internal interconnect connected over the base portion and the external interconnect connected to the first internal interconnect.

17. The system as claimed in claim 14 wherein the integrated circuit device structure includes an integrated circuit die or a carrier.

18. The system as claimed in claim 14 wherein the flex bump includes the offset portion having a fold, a loop, an enlarged end, or a tapered end.

* * * * *